United States Patent [19]
Rhee

[11] Patent Number: 5,646,054
[45] Date of Patent: Jul. 8, 1997

[54] METHOD FOR MANUFACTURING MOS TRANSISTOR OF HIGH BREAKDOWN VOLTAGE

[75] Inventor: Tae-pok Rhee, Seoul, Rep. of Korea

[73] Assignee: Samsung Electronics Co., Ltd., Kyungki-do, Rep. of Korea

[21] Appl. No.: 521,982

[22] Filed: Aug. 31, 1995

[30] Foreign Application Priority Data

Aug. 31, 1994 [KR] Rep. of Korea .................. 94-21904

[51] Int. Cl.$^6$ .................................................. H01L 21/266
[52] U.S. Cl. .............................. 437/30; 437/44; 437/154
[58] Field of Search .............................. 437/29, 30, 41, 437/44, 149, 150, 154

[56] References Cited

U.S. PATENT DOCUMENTS

| | | | |
|---|---|---|---|
| 4,843,023 | 6/1989 | Chiu et al. | 437/30 |
| 4,990,982 | 2/1991 | Omoto | 257/409 |
| 5,217,910 | 6/1993 | Shimizu et al. | 437/30 |
| 5,328,862 | 7/1994 | Goo | 437/44 |
| 5,496,751 | 3/1996 | Wei et al. | 437/154 |

*Primary Examiner*—Chandra Chaudhari
*Attorney, Agent, or Firm*—Cushman Darby & Cushman Intellectual Property Group of Pillsbury Madison & Sutro LLP

[57] ABSTRACT

A high threshold voltage MOS transistor is described having a triple diffused drain structure in which low, medium and high concentration impurity layers overlap each other. The MOS transistor is manufactured according to a method including the steps of: forming a first photosensitive film pattern which partially exposes a region to be formed as a source or a drain on a semiconductor substrate on which a field oxide film is formed; implanting first impurity ions to a low concentration, thereby forming a low concentration impurity layer; removing the first photosensitive film pattern; forming a second photosensitive film pattern which partially exposes the region to be formed as a source or a drain; implanting second impurity ions to a medium concentration, thereby forming a medium concentration impurity layer; removing the second photosensitive film pattern; forming a gate insulation film and gate electrode on the resultant semiconductor substrate; forming a third photosensitive film pattern which partially exposes the region to be formed as a source or a drain on the semiconductor substrate; and implanting third impurity ions to a high concentration, thereby forming a high concentration impurity layer.

4 Claims, 6 Drawing Sheets

METHOD FOR MANUFACTURING MOS TRANSISTOR OF HIGH BREAKDOWN VOLTAGE

BACKGROUND OF THE INVENTION

The present invention relates to a semiconductor device and a method for manufacturing the same, and more particularly, to a metal oxide semiconductor (MOS) transistor of high breakdown voltage having a triple diffused drain and a method for manufacturing the same.

As an example of a semiconductor device which requires a high breakdown voltage and a low resistance is a driver integrated circuit (hereinafter, referred to as a driver IC) used for a liquid crystal display element. The driver IC requires a high breakdown voltage, a high operating voltage, a high current drive capability and a low on-state resistance because it operates by being connected to peripheral equipments.

To satisfy these requirements, the driver IC is designed to have a diffusion layer of a high resistance doped with low concentration impurity. As the concentration of the impurities doped into the diffusion layer lowers, the breakdown voltage becomes higher, but the current drive capability and the operating voltage become lower. Also, a diffusion layer having a low concentration of impurities induces an increase in the operating resistance ($R_{ON}$), which causes a problem in that the size of a chip may be increased.

Double diffused MOS (DMOS), or a metal oxide semiconductor field effect transistor (MOSFET) with a lightly doped drain (LDD) or double diffused drain (DDD) structure is used for an MOS transistor of high breakdown voltage. The DMOS has a structure which is considerably favorable for increasing the operating voltage. However, it is disadvantageous in that the size of chip is relatively large. It is difficult for a transistor with a DDD or LDD structure to obtain an adequate maximum operating voltage (($V_{op})_{max}$).

To overcome these disadvantages, a complex diffused drain (hereinafter, referred to as CDD) structure in which an N source/drain (its impurity concentration is lower than N$^+$, but higher than N$^-$) is added to an N$^-$ source/drain and an N$^+$ source/drain constituting a conventional DDD or a mask islanded DDD (MIDDD) is used to obtain a higher maximum operating voltage, a larger drain current ($I_{ds}$ current) and a lower operating resistance ($R_{ON}$) than those of transistors with other structures when used in a chip of the same size.

FIG. 1 is a cross-sectional view of an MOS transistor of high breakdown voltage according to a conventional method disclosed in U.S. Pat. No. 4,990,982 (entitled "Semiconductor Device of High Breakdown Voltage", issued to Kayoko Omoto et al. on Feb. 5, 1992), which shows a CDD structure.

In FIG. 1, the reference numeral 10 denotes a semiconductor substrate, 12 denotes an N source, 14 denotes an N$^+$ drain, 16 denotes a gate oxide film, 18 and 28 denote oxide films, 20 denotes a gate electrode, 22 denotes an N$^-$ drain, 24 denotes an N drain, 26 denotes an N$^-$ region, 30 denotes an interlayer insulation film, 32$a$ and 32$b$ denote contact holes, and 34$a$ and 34$b$ denote source and drain electrodes respectively.

To increase the maximum operating voltage of the CDD structure as shown in FIG. 1, the amount of ions implanted to the N$^-$ region should be increased, thereby decreasing the second peak value of the $I_{sub}$ current, of which the limit is the drain breakdown voltage ($BV_{dss}$).

Therefore, the transistor of a CDD structure having the N source/drain formed by additional ion implantation is developed so as to increase the maximum operating voltage by lowering the second peak value of $I_{sub}$ current, while keeping the limit of $BV_{dss}$ value to an appropriate level.

SUMMARY OF THE INVENTION

An object of the present invention is to provide an MOS transistor of high breakdown voltage which increases the maximum operating voltage.

Another object of the present invention is to provide a method for manufacturing the above MOS transistor.

To achieve a first object, the high breakdown voltage MOS transistor is provided with: a semiconductor substrate; a gate insulation film formed on the semiconductor substrate; a gate electrode formed on the gate insulation film; and an impurity diffusion layer formed by overlapping low, medium and high concentration impurity layers on the semiconductor substrate of at least one side of the gate electrode.

It is preferred that the one side is the drain side.

It is preferred that the lateral junctions of the low, medium and high concentration impurity layers are disposed in sequence of low, medium and high concentration impurity layers. Also, it is preferred that the lateral junction of the medium concentration impurity layer meets that of the low concentration impurity layer or is located therein, and that the lateral junction of the high concentration impurity layer meets that of the medium concentration impurity layer or is located therein.

Here, it is preferred that the size difference between the lateral junctions of the medium concentration impurity layer and the low concentration impurity layer is not less than 1.0 µm.

It is further preferred that the size difference between the lateral junctions of the high concentration impurity layer and the medium concentration impurity layer is not less than 1.0 µm.

The lower side junction of the high concentration impurity layer is preferably located within the medium or low concentration impurity layer, and that the lower side junction of the high, medium and low concentration impurity layers are disposed in sequence of high, low and medium impurity layers from the surface of the semiconductor substrate.

It is preferred that the lower side junction of the high concentration impurity layer is surrounded by the medium concentration impurity layer.

It is preferred that the lower side junction of the low concentration impurity layer is formed more shallow than that of the high concentration impurity layer.

It is preferred that the low concentration impurity layer is formed around a region where a contact hole is to be formed.

To achieve the second object, there is a method for manufacturing the MOS transistor of high breakdown voltage according to the present invention comprising the steps of: (a) forming a first photosensitive film pattern which partially exposes a region to be formed as a source or a drain on the semiconductor substrate; (b) implanting first impurity ions to a low concentration thereby forming a low concentration impurity layer; (c) removing the first photosensitive film pattern; (d) forming a second photosensitive film pattern which partially exposes the region to be formed as a source or a drain on the semiconductor substrate; (e) implanting a second impurity ions to a medium concentration, thereby forming a medium concentration impurity layer; (f) removing the second photosensitive film pattern; (g) forming a gate insulation film and a gate electrode on the resultant semiconductor substrate; (h) forming a third photosensitive film pattern which partially exposes the region to be formed as a source or a drain; and (i) implanting third impurity ions to a high concentration, thereby forming a high concentration impurity layer.

The size of the region exposed to be formed as a source or a drain by the second photosensitive film pattern is equal to or smaller than that exposed by the first photosensitive film pattern. Also, the size of the region exposed to be formed as a source or a drain by the third photosensitive film pattern is equal to or smaller than that exposed by the second photosensitive film pattern.

It is more preferable that the step (b) be performed by implanting a phosphorus ion in a dose of 2.0–7.0E12 atoms/cm$^2$ at an energy level of 130–200 KeV, the step (e) be performed by implanting a phosphorus ion in a dose of 3E12 –3E13 atoms/cm$^2$ at an energy level of 160–200 KeV, and the step (i) be performed by implanting an arsenic ion in a dose of 6E15 atoms/cm$^2$ at an energy level of 80 KeV.

After the step (f), a drive-in process is additionally performed for 30 minutes at 1,100° C. Also, it is possible to further comprise the step of implanting the same type impurity ion as that included in the semiconductor substrate in the semiconductor substrate region on which a field insulation film is to be formed, prior to the step of forming the field oxide film.

According to the MOS transistor of high breakdown voltage according to the present invention and the method for manufacturing the same, it is possible to produce a transistor with better operating voltage characteristics than that of the DDD structure or the LDD structure.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
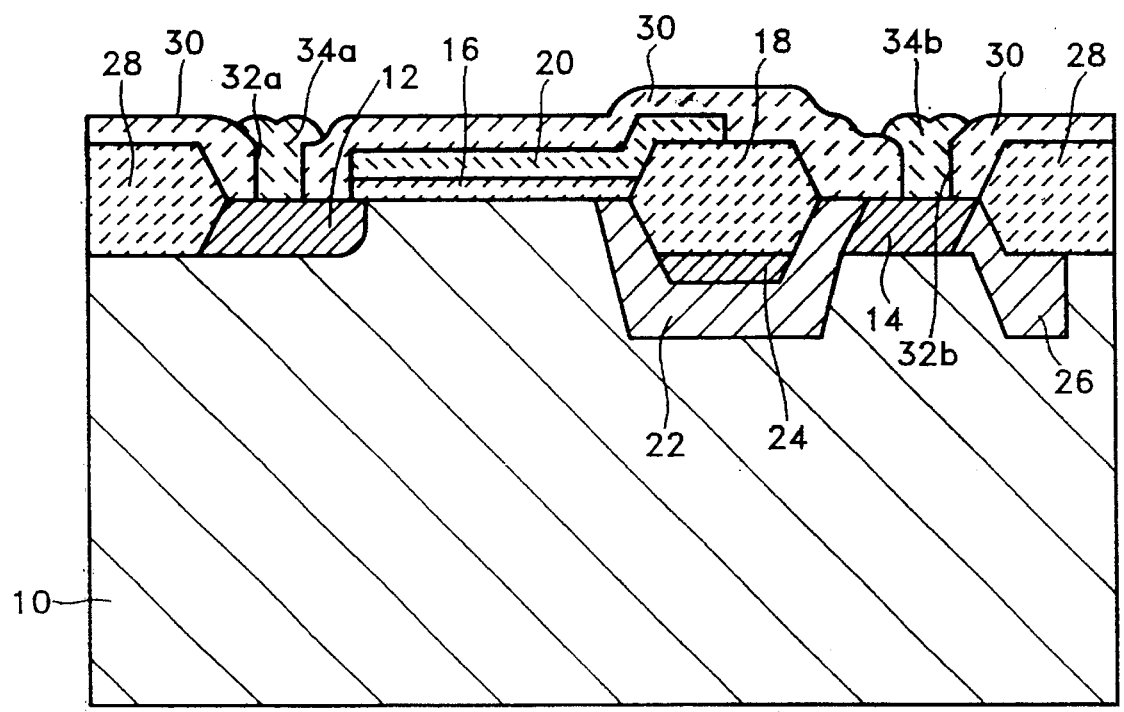
FIG. 1 is a cross-sectional view of a conventional MOS transistor having a high breakdown voltage.
Figure 2:
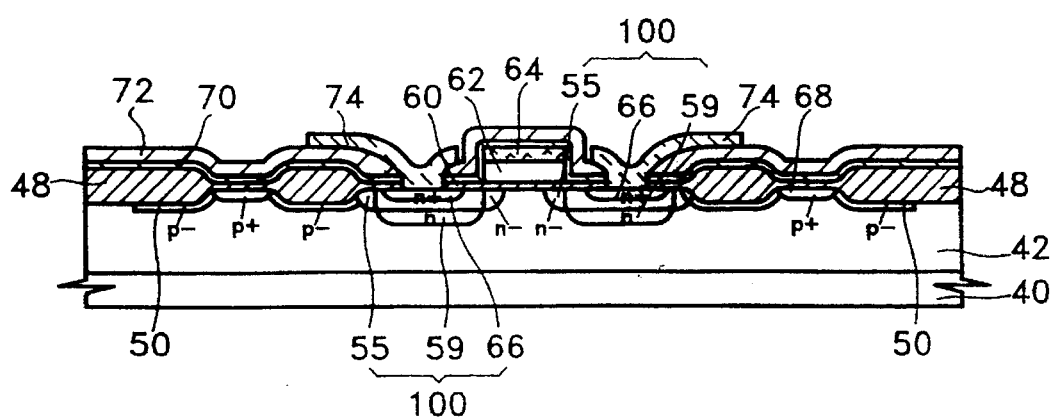
FIG. 2 is a cross-sectional view of a high breakdown voltage MOS transistor manufactured according to a first embodiment of the present invention.

FIG. 2 is a cross-sectional view of an MOS transistor of high breakdown voltage manufactured according to the first embodiment of the present invention, which shows an MOS transistor with a CDD structure in which impurity layers of low, medium and high concentration overlap each other.

In FIG. 2, the reference numeral 40 denotes a semiconductor substrate, 42 denotes a P-well, 48 denotes a field oxide film, 50 denotes a channel stop layer, 55 denotes an N$^-$ source/drain, 59 denotes an N source/drain, 60 denotes a gate insulation film, 62 denotes polycrystalline silicon of gate electrodes, 64 denotes tungsten silicide of gate electrodes, 66 denotes an N$^+$ source/drain, 68 denotes a P$^+$ guard-ring, 70 and 72 denote insulation films, 74 denotes a source/drain electrode, and 100 denotes a source/drain.

The source/drain 100 is formed as a CDD structure in which low concentration impurity layer 55 (N$^-$), medium concentration impurity layer 59 (N) and high concentration impurity layer 66 (N$^+$) overlap each other. The lateral junction of the medium concentration impurity layer 59 meets that of the low concentration impurity layer 55 or is located therein, and the lateral junction of the high concentration impurity layer 66 meets that of the medium concentration impurity layer 59 or is located therein.

Also, the lower side junction of the semiconductor substrate of high concentration impurity layer 66 is surrounded by the low concentration layer 55 and/or medium concentration impurity layer 59 so that high concentration layer 66 does not form a junction with the semiconductor substrate. The lower side junction of the semiconductor substrate of low concentration impurity layer 55 meets that of the medium concentration layer or is located therein so that medium concentration impurity layer 59 and the semiconductor substrate form a junction. Here, the junction depth of low concentration impurity layer 55 may be formed deeper than that of the medium concentration impurity layer 59 so that low concentration impurity layer 55 and the semiconductor substrate form a junction.

Each impurity layer is formed by performing a corresponding ion implantation step. Low concentration impurity layer 55 is formed by implanting a phosphorus ion (Ph$^+$) to the semiconductor substrate in a dose of 5E12 atoms/cm$^2$ at an energy level of 150 KeV, medium concentration impurity layer 59 is formed by implanting a phosphorus ion (Ph$^+$) in a dose of 3E13 atoms/cm$^2$ at an energy level of 180 KeV, and high concentration impurity layer 66 is formed by implanting an arsenic ion in a dose of 6E15 atoms/cm$^2$ at an energy level of 80 KeV.

Guard-ring 68 for channel-protecting is formed in a shape which surrounds the MOS transistor's of CDD structure. Guard-ring 68 is formed by implanting difluoroboron (BF$^{2+}$) into the semiconductor substrate in a dose of 6E15 atoms/cm2 at an energy level of 60 KeV.

Gate electrodes 62 and 64 are formed in a laminated structure of polycrystalline silicon and tungsten silicide (WSi$_x$), and gate insulation film 60 is formed below the gate electrode. Source/drain electrode 74 is connected to source/drains 100 of CDD structures 55, 59 and 66 through insulation film 72.

FIG. 2 shows a cross-sectional view of a MOS transistor in which both the source and the drain are formed into the CDD structure. However, even though only the drain is formed into the CDD structure, the high operating voltage effect pursued by the present invention remains the same.

Figure 3:
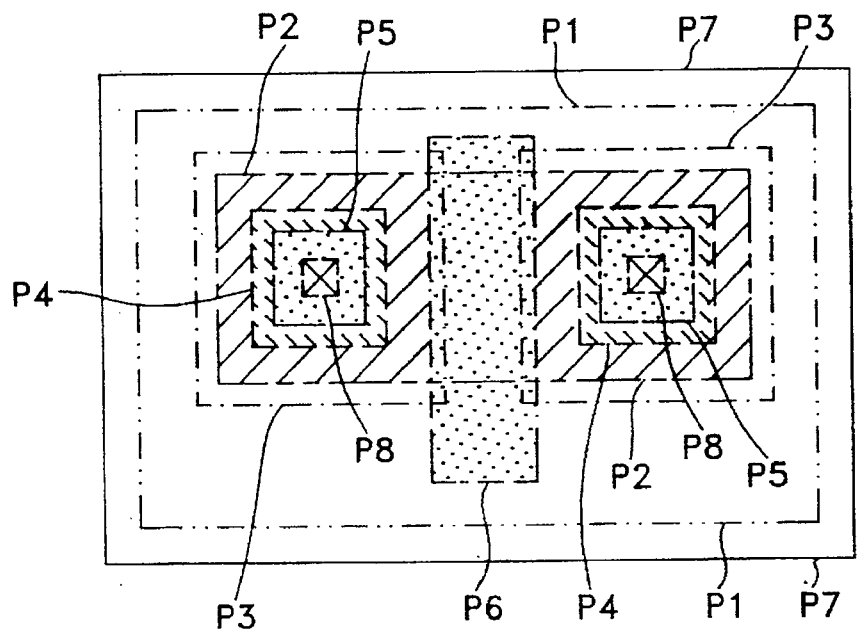
FIG. 3 is a layout of the mask pattern used for manufacturing the MOS transistor of FIG. 2.

FIG. 3 is a layout showing the mask pattern used for manufacturing the MOS transistor of FIG. 2. The reference symbol P1 denotes a Mask pattern for forming a P-well, P2 denotes one for forming a field oxide film, P3 denotes one for forming a low concentration (N$^-$) impurity layer, P4 denotes one for forming a medium concentration (N) impurity layer, P5 denotes one for forming a high concentration (N$^+$) impurity layer, P6 denotes one for forming a gate electrode, and P7 denotes one for forming a guard-ring.

As shown in FIG. 3, it is preferable that the layout for forming the CDD structure of the MOS transistor according to the first embodiment of the present invention to be disposed so that mask pattern P5 is included in mask pattern P4, and so that the mask pattern P4 is included in mask pattern P3.

Figure 4A:
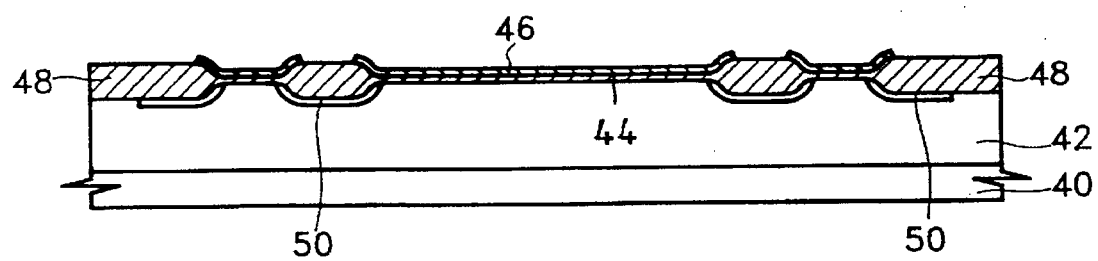
FIGS. 4A through 4G are cross-sectional views showing each step of the method for manufacturing the MOS transistor of FIG. 2.

FIGS. 4A though 4G are cross-sectional views showing each step of a method for manufacturing a MOS transistor as illustrated in FIG. 2, for explaining the first embodiment of the present invention with reference to the layout of FIG. 3.

First, FIG. 4A shows the step of forming field oxide film 48 and channel stop layer 50. This step comprises steps of: growing pad oxide film 44 (for example, with a thickness of about 380Å) on P-type semiconductor substrate 40 of which the intrinsic resistance is about 18 $\Omega$-cm; forming a photosensitive film pattern (not shown) for forming a P-well on the semiconductor substrate by using mask pattern P1 and thereafter implanting boron (B) ions into the semiconductor substrate in a dose of 1.0E12 atoms/cm$^2$ at an energy level of 100 KeV, which is applied to the drive-in process for 13 hours at a temperature of 1,150° C. to form P-well 42; forming a nitride film (for example,with a thickness of about 1,000 Å.) on the resultant structure, and thereafter carrying out photolithography using mask pattern P2 to form a nitride film pattern 46; implanting boron ions in a dose of 5.0E13 atoms/cm$^2$ at an energy level of 30 KeV into the semiconductor substrate, in order to increase the threshold voltage of the transistor and intercept leakage current flowing to the lower part of the field oxide film, to form a channel stop layer 50; and oxidizing a region between nitride film patterns 46 by using a conventional oxidation process to form a field oxide film 48 for limiting the semiconductor substrate to the active region and the inactive region.

Figure 4B:
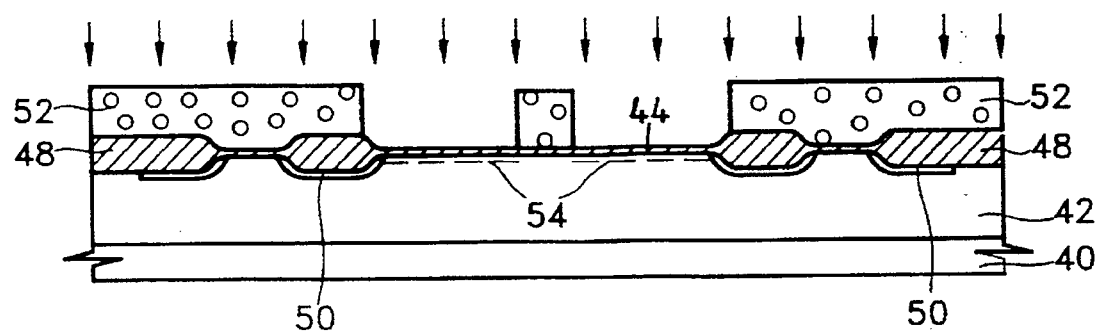

FIG. 4B shows the ion implantation step for forming the low concentration impurity layer (not shown). This process is performed in the steps of: removing the nitride film pattern (reference numeral 46 in FIG. 4A) with a phosphoric acid solution; carrying out photolithography using mask pattern P3 to form photosensitive film pattern 52 for forming a low concentration impurity layer on the semiconductor substrate; and implanting phosphorous ions into the semiconductor substrate in a dose of 2.0E12–7.0E12 atoms/cm$^2$ at an energy level of 130–200 KeV to form first ion implantation layer 54 for forming a low concentration impurity layer.

Photosensitive film pattern 52 is formed exposing certain regions for forming the source/drain of the transistor.

Figure 4C:
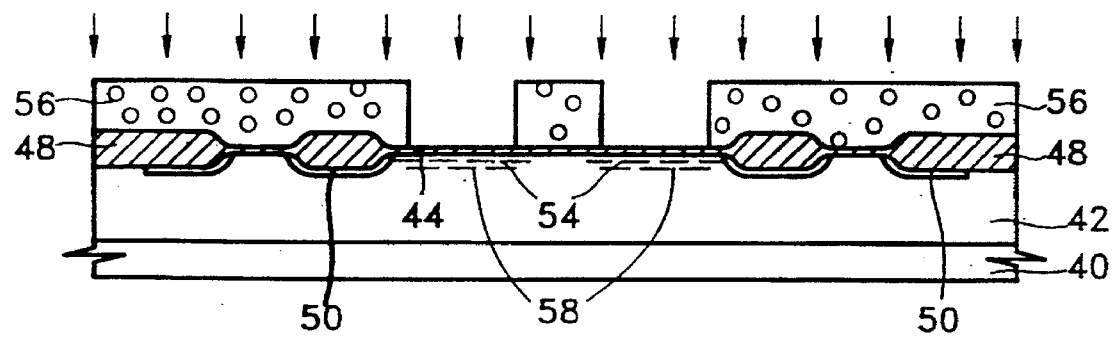

FIG. 4C shows a step of implanting ions to form a medium concentration impurity layer (not shown). This step comprises steps of: removing a photosensitive film pattern (reference numeral 52 in FIG. 4B); carrying out photolithography using mask pattern P4 to form photosensitive film pattern 56 for forming a medium concentration impurity layer on the semiconductor substrate; and implanting phosphorous ions into the semiconductor substrate in a dose of 3E12–3E13 atoms/cm$^2$, at an energy level of 160–200 KeV, to form second ion implantation layer 58 for forming a medium concentration impurity layer 66.

Photosensitive film pattern 56 is formed exposing certain regions for forming the source/drain of the transistor. The exposed size is smaller than that of photosensitive film pattern 52.

The size difference between patterns 52 and 56 depends on the operating voltage. It is preferred that the size difference is not less than 1.0 µm.

Figure 4D:
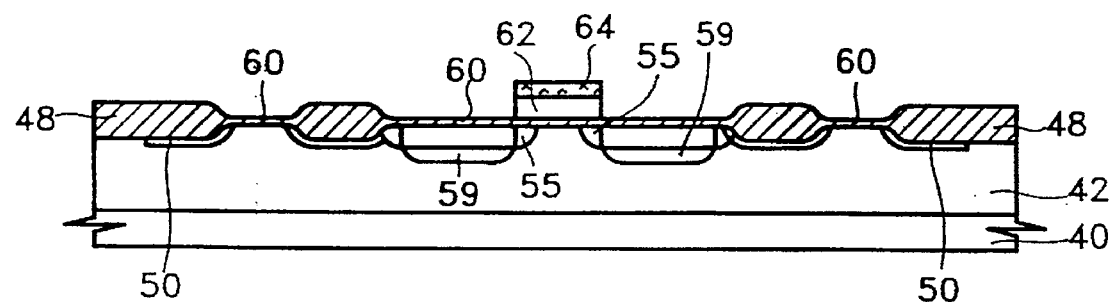

FIG. 4D shows the step of forming gate electrodes 62 and 64. This step comprises further steps of: removing the photosensitive film pattern (reference numeral 56 in FIG. 4C); diffusing first and second ion implantation layers (reference numerals 54 and 58 in FIG. 4C) by carrying out a drive-in process for 30 minutes at 1,100° C. to form low concentration impurity layer 55 and medium concentration impurity layer 59; removing the pad oxide film (reference numeral 44 in FIG. 4C); growing the oxide film having a thickness of, for example, 1,100 Å, to form gate insulation film 60; and depositing polycrystalline silicon 62 to a thickness of about 2,500 Å and tungsten silicide (WSi$_x$) to a thickness of about 2,000 Å, and thereafter carrying out photolithography using mask pattern P6 to form gate electrodes 62 and 64.

At this time, the lateral junction of medium concentration impurity layer 59 meets that of low concentration impurity layer 55 or is located therein. Also, the lower side junction of the semiconductor substrate of low concentration impurity layer 55 meets that of medium concentration impurity layer 59, or is located therein.

Figure 4E:
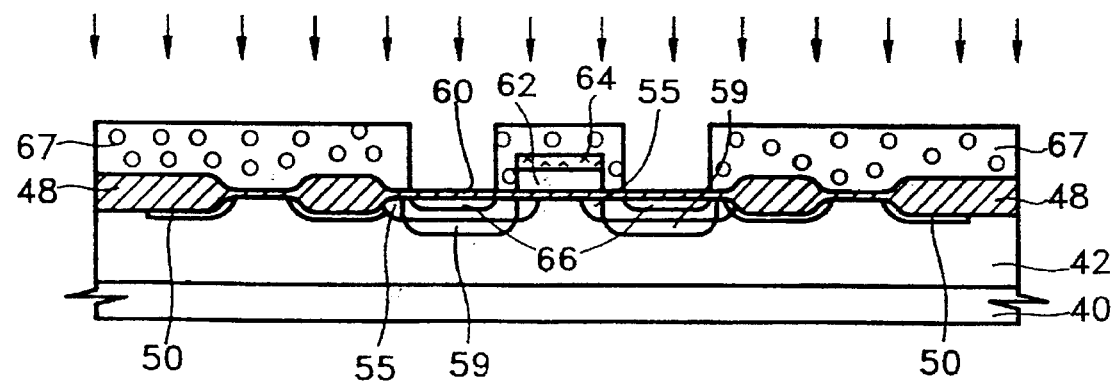

FIG. 4E shows the step of forming high concentration impurity layer 66. The step comprises steps of: carrying out photolithography using mask pattern P5 to form photosensitive film pattern 67 for forming a high concentration impurity layer; and implanting arsenic ions into the semiconductor substrate in a dose of 6E15 atoms/cm$^2$, at an energy level of 80 KeV to form high concentration impurity layer 66.

At this time, the lateral junction of high concentration impurity layer 66 meets that of medium concentration impurity layer 59, or is located therein. Also, the lower side junction of the semiconductor substrate of high concentration impurity layer 66 is surrounded by medium concentration impurity layer 59 or low concentration impurity layer 55 so that high concentration impurity layer 66 and the semiconductor substrate do not form a junction.

Figure 4F:
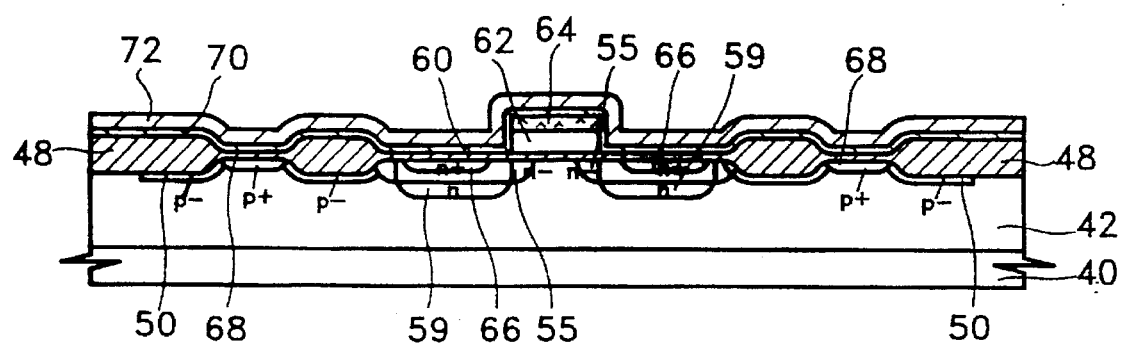

FIG. 4F shows a step of forming guard-ring 68 and first and second insulation films 70 and 72. This step comprises steps of: removing the photosensitive film pattern (reference numeral 67 in FIG. 4E); carrying out photolithography on the resultant structure by using mask pattern P7 to form a photosensitive film pattern (not shown) for forming the guard-ring; implanting difloroboron ions into the semiconductor substrate in a dose of 6E15 atoms/cm$^2$, at an energy level of 60 KeV to form guard-ring 68; removing the photosensitive film pattern for forming the guard-ring; and laminating, for example, a high temperature oxide film and borophosphorus silicate glass (BPSG) all over the resultant to form first and second insulation films 70 and 72.

Figure 4G:
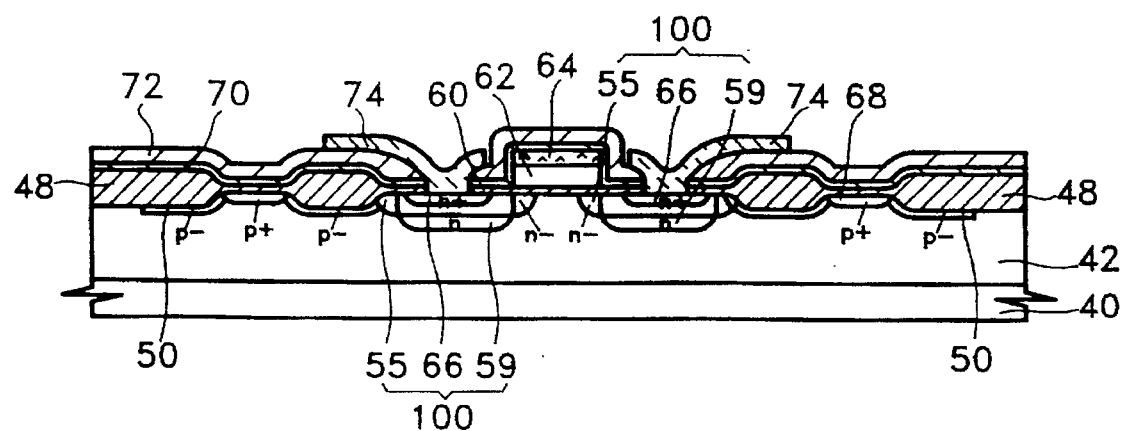

FIG. 4G shows a step for forming source/drain electrode 74. This step comprises steps of: carrying out photolithography using mask pattern P8 to form a photosensitive film pattern for forming a contact hole on second insulation film 72; removing first and second insulation films 70 and 72 by part of their thickness by wet etching, and thereafter etching first and second insulation films 70 and 72 by dry etching until the substrate is exposed to form a contact hole exposing source/drain 100; and depositing, for example, aluminum comprising 1% silicon and 0.5% copper to a thickness of 1 µm, and thereafter carrying out photolithography to form source/drain electrode 74.

Figure 5:
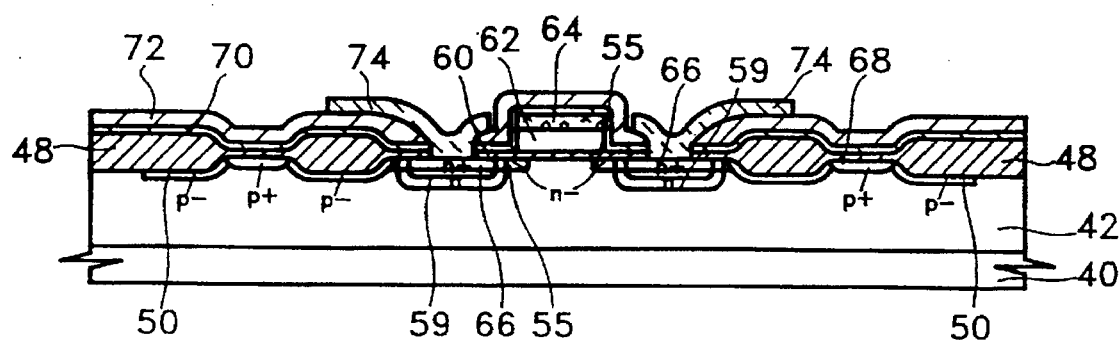
FIG. 5 is a cross-sectional view of a high breakdown voltage MOS transistor of manufactured according to a second embodiment of the present invention.

FIG. 5 is a cross-sectional view of a high breakdown voltage MOS transistor manufactured according to the second embodiment of the present invention. In this MOS transistor, the lower side junctions of low, medium and high concentration impurity layers 55, 59 and 66 are disposed in sequence of low, high and medium concentration impurity layers 55, 66 and 59, respectively, from the surface of the semiconductor substrate. The lateral junctions of low, medium and high concentration impurity layers 55, 59 and 66 are disposed in sequence of low, medium and high concentration impurity layers 55, 59 and 66 from the channel region.

Figure 6:
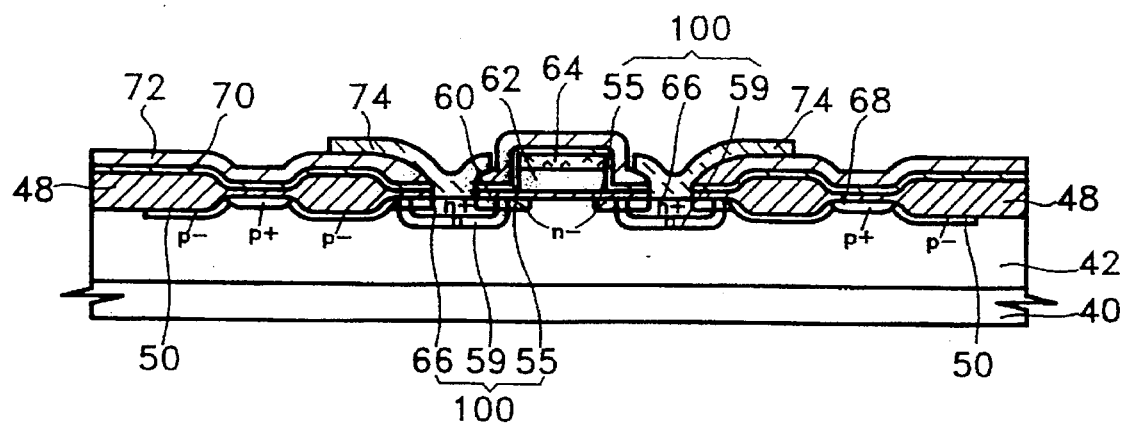
FIG. 6 is a cross-sectional view of a high breakdown voltage MOS transistor manufactured according to a third embodiment of the present invention.
Figure 7:
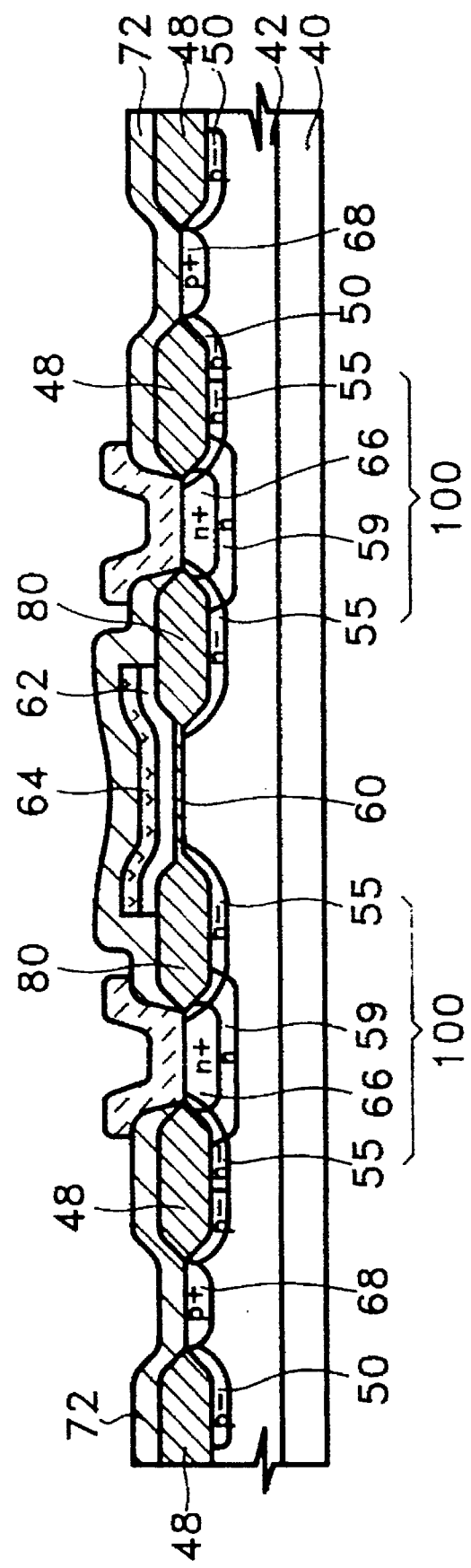
FIG. 7 is a cross-sectional view of a high breakdown voltage MOS transistor of manufactured according to a fourth embodiment of the present invention.

FIGS. 6 and 7 are cross-sectional views of a high breakdown voltage MOS transistors manufactured according to the third and forth embodiments of the present invention. In these transistors, low concentration impurity layer 55 is formed around the region where a contact hole is to be formed for connecting source and drain electrodes to source and drain 100 of the transistor, respectively. In FIG. 7, reference numeral 80 denotes an oxide film.

Therefore, according to the MOS transistor of high breakdown voltage of the present invention and the method for manufacturing the same, a transistor having a high operating voltage can be manufactured.

The present invention is not limited to the above embodiments and many other variations may be available to those skilled in this art.

What is claimed is:

1. A method for manufacturing an MOS transistor of high breakdown voltage comprising the steps of:

(a) forming a first photosensitive film pattern which partially exposes a region to be formed as a source or a drain on a semiconductor substrate;

(b) implanting first impurity ions to a low concentration, thereby forming a low concentration impurity layer;

(c) removing said first photosensitive film pattern;

(d) forming a second photosensitive film pattern which partially exposes said region to be formed as a source or a drain;

(e) implanting second impurity ions to a medium concentration, thereby forming a medium concentration impurity layer;

(f) removing said second photosensitive film pattern;

(g) forming a gate insulation film and gate electrode on the resultant semiconductor substrate;

(h) forming a third photosensitive film pattern which partially exposes said region to be formed as a source or a drain on said semiconductor substrate; and (i) implanting third impurity ions to a high concentration, thereby forming a high concentration impurity layer.

2. A method for manufacturing an MOS transistor of high breakdown voltage as claimed in claim 1, wherein the size of said region exposed to be formed as a source or drain by said second photosensitive film pattern is smaller than or the same as that exposed by said first photosensitive film pattern, and the size of said region exposed to be formed as a source or drain by said third photosensitive film pattern is smaller than or the same as that exposed by said second photosensitive film pattern.

3. A method for manufacturing an MOS transistor of high breakdown voltage as claimed in claim 2, wherein said step (b) is performed by implanting phosphorus ions in a dose of 2.0–7.0E12 atoms/cm$^2$ at an energy level of 130–200 KeV, said step (e) is performed by implanting phosphorus ions in a dose of 3E12–3E13 atoms/cm$^2$ at an energy level of 160–200 KeV and said step (i) is performed by implanting arsenic ions in a dose of 6E15 atoms/cm$^2$ at an energy level of 80 KeV.

4. A method for manufacturing an MOS transistor of high breakdown voltage as claimed in claim 1 further comprises a step of carrying out a drive-in process for 30 minutes at 1,100° C. after said step (f).

* * * * *